United States Patent [19]

Chiao-Yen

[11] Patent Number: 5,862,367
[45] Date of Patent: Jan. 19, 1999

[54] APPARATUS AND METHOD FOR SERIAL-TO-PARALLEL DATA CONVERSION AND TRANSMISSION

[75] Inventor: Tai Chiao-Yen, Hsinchu, Taiwan

[73] Assignee: United Micro Electronics Corporation, Hsinchu, Taiwan

[21] Appl. No.: 726,925

[22] Filed: Oct. 7, 1996

Related U.S. Application Data

[63] Continuation-in-part of Ser. No. 406,179, Mar. 17, 1995, abandoned.

[51] Int. Cl.$^6$ .............................. G06F 3/00; H04L 12/00
[52] U.S. Cl. ......................... 395/500; 395/566; 395/821; 364/489; 341/100; 370/389
[58] Field of Search .................... 395/500, 566, 395/821, 851; 711/200, 211; 364/259.9, 260, DIG. 1; 341/100, 101; 370/392, 389, 351, 355

[56] References Cited

U.S. PATENT DOCUMENTS

| | | | |
|---|---|---|---|
| 3,310,626 | 3/1967 | Cassidy, Jr. | 178/50 |
| 3,693,166 | 9/1972 | Rawson et al. | 340/172.5 |
| 4,177,511 | 12/1979 | Taddei | 364/200 |
| 4,410,962 | 10/1983 | Daniels et al. | 364/900 |
| 4,608,689 | 8/1986 | Sato | 371/15 |
| 4,728,930 | 3/1988 | Grote et al. | 340/347 |
| 4,747,047 | 5/1988 | Coogan et al. | 364/200 |
| 4,789,960 | 12/1988 | Willis | 364/900 |
| 4,833,605 | 5/1989 | Terada et al. | 364/200 |
| 4,864,303 | 9/1989 | Ofek | 341/95 |
| 4,866,667 | 9/1989 | Shimada | 364/900 |
| 4,885,583 | 12/1989 | McCambridge | 341/100 |
| 4,954,826 | 9/1990 | Isozaki et al. | 341/100 |
| 4,975,834 | 12/1990 | Xu et al. | 364/200 |
| 5,005,151 | 4/1991 | Kurkowski | 364/900 |
| 5,055,842 | 10/1991 | Mueller | 341/100 |
| 5,430,859 | 7/1995 | Norman et al. | 395/425 |
| 5,537,517 | 7/1996 | Wakabayashi et al. | 395/115 |

OTHER PUBLICATIONS

Yamanaka et al., "Novel Structure for Highspeed Multihighway S/P Converter", IEEE, 1988, pp. 1221–1225.
Burrier et al., "Monolithic GaAs Programmable P/S and S/P Converters", IEEE, 1990, pp. 587–590.

*Primary Examiner*—Kevin J. Teska
*Assistant Examiner*—Thai Phan
*Attorney, Agent, or Firm*—Frommer Lawrence & Haug LLP

[57] ABSTRACT

A serial-to-parallel data conversion and transmission system for converting incoming serial data sent by another system. The incoming data contains a data portion and identifying information and is converted into parallel data in response to a chip select signal. The apparatus is operable to store the data portion of the incoming data in a first register array, which is coupled to a multiple of receiving devices; and to store the identifying information in a second register array, which is coupled to a decoder. The decoder reads the identifying information from the second register array and decodes the information to determine which receiving device(s) should receive the data portion. The data portion is then transmitted from the first register array to the selected receiving device(s). The data portion is converted from serial data to parallel data upon passing through the first register array, and thus parallel data is transmitted to the selected receiving device(s).

16 Claims, 8 Drawing Sheets

APPARATUS AND METHOD FOR SERIAL-TO-PARALLEL DATA CONVERSION AND TRANSMISSION

RELATED APPLICATION

This is a continuation-in-part of U.S. Pat. application Ser. No. 08/406,179, filed Mar. 17, 1995 now abandoned.

BACKGROUND OF THE INVENTION

1. Field of the Invention

The present invention relates in general to serial-to-parallel data conversion and transmission devices. In particular, the present invention relates to serial to parallel data conversion and transmission device for direct transmission to a receiving device without the intervention of a processor.

2. Technical Background

Conventional serial-to-parallel data conversion and transmission devices are widely employed in data communication devices. For example, in a computer system receiving remote data via the telephone network, a serial-to-parallel data conversion and transmission device would convert serially transmitted information bits sent from a remote system and received at the local end into multi-bit, for example, bytes of data, and subsequently send the received multi-bit, or, in other words, parallel data to other sections in the computer system for processing.

FIG. 1 of the accompanying drawings is a schematic block diagram showing the conventional scheme for serial-to-parallel data conversion and transmission. As shown, a device A sends data to another device B over a serial data communication line DA. For example, device A and B may be personal computers, and the serial data communication line DA may be a local connection, e.g., an RS-232A bus.

Device A transmits data over the serial data link DA to device B, and the received data is converted from serial to parallel data format and stored in one of the receivers 142, 144, 146 and 148. A data conversion and transmission device 10, such as a shift register-based device, receives the incoming serial data, converts the data from serial to parallel format, and sends the data to a processor 12, such as a CPU of device B, which assigns the data to one of the receivers 142, 144, 146 and 148 for storage.

Referring to FIG. 2 of the drawings, a timing diagram of the material signals in the serial-to-parallel data conversion and transmission scheme of FIG. 1 is shown for describing the operation of a conventional device. The operation of data conversion and transmission is as follows.

(1) When an active-high chip select signal CS, e.g., a logic one, is issued, device A is prohibited from transmitting data to device B.

(2) When signal CS changes and remains in the logic zero state, and a clock signal CK changes from logic zero to logic one, device A is permitted to send data to device B.

(3) When clock signal CK changes from logic one to logic zero while chip-select CS signal remains at logic zero, the data sent over data line DA is stored in the data conversion and transmission device 10.

(4) Steps (2) and (3) are repeated for each bit supplied on data line DA.

(5) Processor 12 in device B passes the data stored in data conversion and transmission device 10 in parallel form to receiver 142, 144, 146 or 148.

In the above-described conventional scheme of serial-to-parallel data conversion and transmission, system processor 12 (usually the CPU of device B) is required to intervene in order to supply data stored in data conversion and transmission device 10 to one of the receivers. This requirement not only adds to the load of the CPU of a computer system, but also reduces data transmission throughput in this serial-to-parallel data conversion and transmission system, since a heavily loaded processor must utilize critical time to process the required receiver assignment.

OBJECTS OF THE INVENTION

It is therefore an object of the present invention to provide a serial-to-parallel data conversion and transmission apparatus and method capable of transmitting data without the intervention of a processor of the receiving system.

It is another object of the present invention to provide a serial-to-parallel data conversion and transmission apparatus and method which improves the serial-to-parallel data conversion and transmission process.

SUMMARY OF THE INVENTION

The present invention achieves the above indicated objects by providing a serial-to-parallel data conversion and transmission apparatus of a digital system for converting received serial data supplied by another digital system. The received data contains identifying information and is converted into parallel form in response to a chip select signal. The converted parallel data is transmitted to a selected one of a number of receiving devices of the system. The apparatus comprises a first register array for storing the data portion of the incoming data. The first register array transmits the stored data to the selected receiving device identified by the identifying information. A second register array stores the identifying information; the second register array is coupled to the first register array. A decoder is coupled to the second register array and decodes the identifying information. The decoded identifying information is utilized for sending an index signal to the identified receiving device. An enable pulse generator is coupled to the decoder and supplies an enable pulse signal to the decoder in response to the chip select signal. The decoder outputs the index signal to one of the receivers that corresponds to the identifying information which allows the selected receiver to receive the data portion of the incoming data sent by the first register array.

BRIEF DESCRIPTION OF THE DRAWINGS

Other objects, features and advantages of the present invention will become apparent by way of the following detailed description of the preferred but non-limiting embodiments. The description is made with reference to the accompanied drawings, wherein.

DETAILED DESCRIPTION OF CERTAIN PREFERRED EMBODIMENTS

Figure 1:
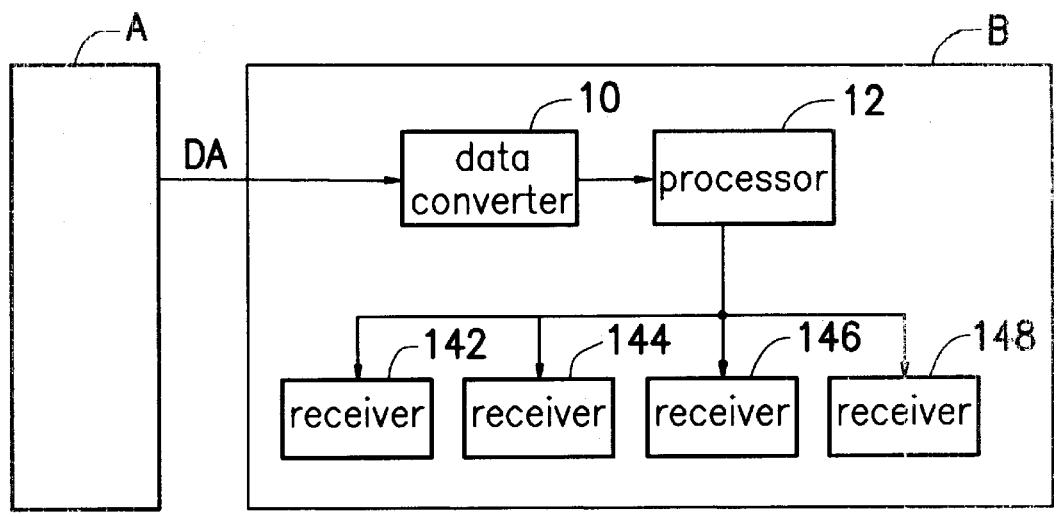
FIG. 1 is a block diagram showing a conventional serial-to-parallel data conversion and transmission scheme.
Figure 2:
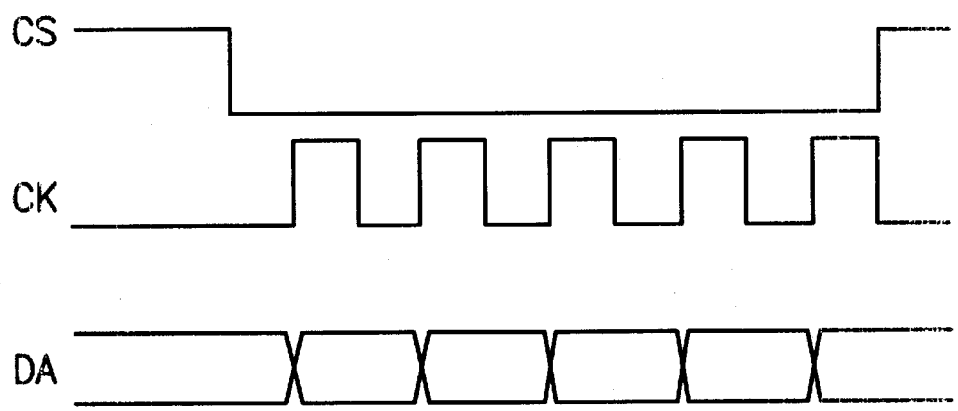
FIG. 2 is a timing diagram of several signals in the serial-to-parallel data conversion and transmission scheme of FIG. 1.
Figure 3:
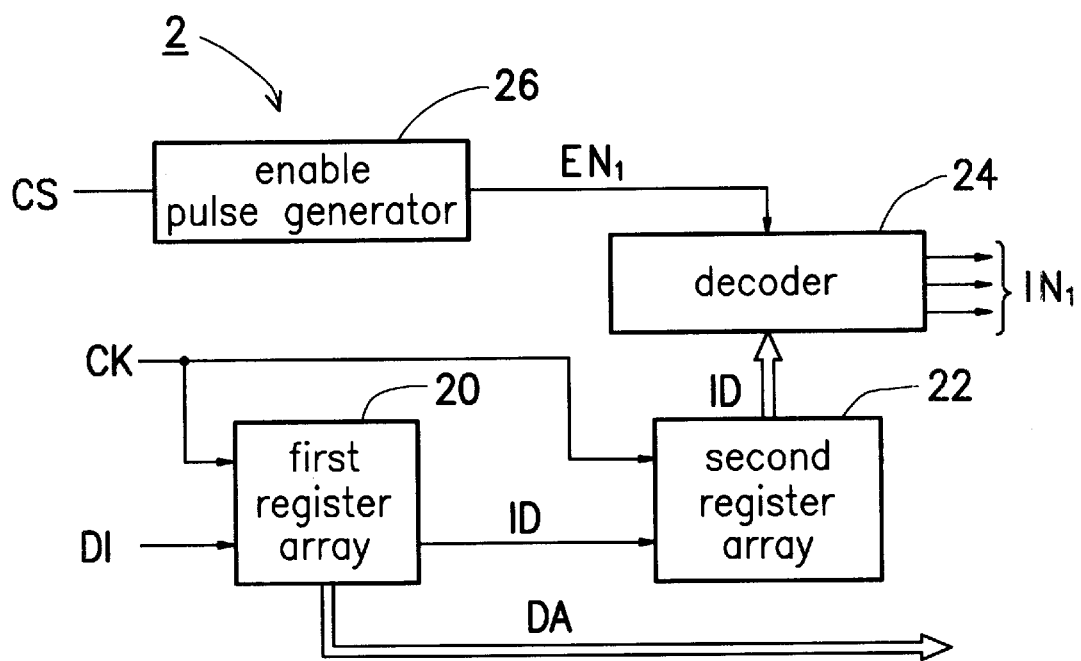
FIG. 3 is a block diagram of a serial-to-parallel data conversion and transmission apparatus in accordance with a preferred embodiment of the present invention.

Referring to FIG. 3 of the drawings, a block diagram of a serial-to-parallel data conversion and transmission apparatus 2 in accordance with a preferred embodiment of the present invention is shown. The serial-to-parallel data conversion and transmission apparatus 2, in response to a chip select signal CS, is capable of supplying incoming data DI which contains an identifying code portion ID (e.g. 3-bits) and a data portion DA (e.g. 4-bits) to at least one of a number of receiving devices, such as receivers 142, 144, 146 and 148 of device B shown in FIG. 1 for storage therein.

The serial-to-parallel data conversion and transmission apparatus 2, as shown in FIG. 3, comprises a first register array 20, a second register array 22, a decoder 24, and an enable pulse generator 26. First register array 20 stores data DA included in incoming data DI which is ultimately converted from serial to parallel format and transmitted for storage and processing. First register array 20 is coupled to the receivers and supplies data DA to the receiver identified by identifying code ID for storage and subsequent processing.

Figure 4:
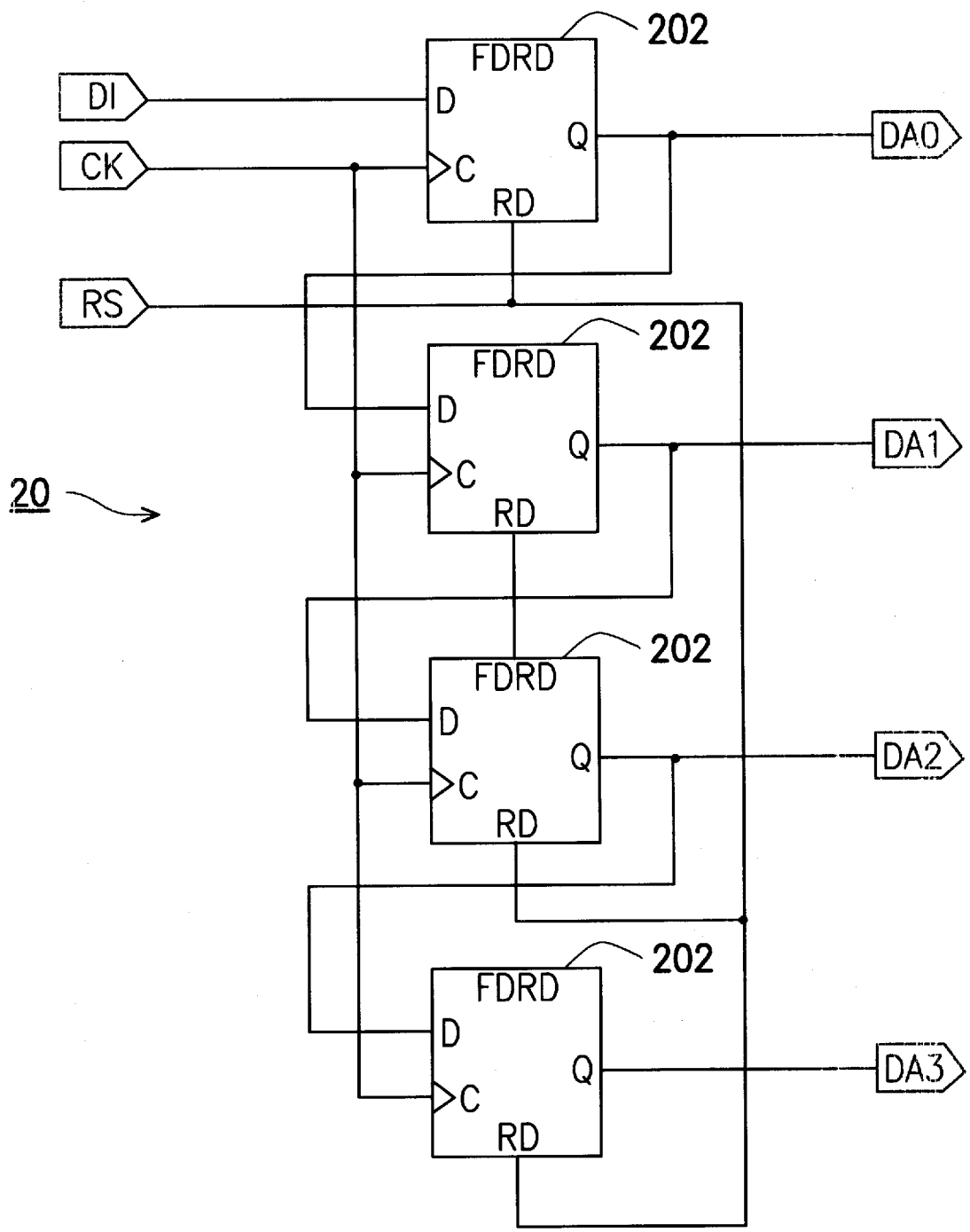
FIG. 4 is a schematic diagram of the first register array employed in the serial-to-parallel data conversion and transmission apparatus of FIG. 3.

FIG. 4 is a schematic diagram of register array 20. As shown, register array 20 may include several D-type flip-flops 202 connected in cascade fashion and clocked together, thereby functioning as a shift-register which converts each bit of data DA into a multi-bit parallel data format comprising bits DA0, DA1, DA2 and DA3, producing a four-bit data word in this array. D-type flip-flops 202 are also supplied with a common reset signal RS (and a common clock signal CK) so that the shift-register may be cleared after each serial-to-parallel data conversion cycle.

Second register array 22 is coupled to first register array 20 (FIG. 3) and receives and stores identifying code ID which is supplied from register array 20. Second register array 22 outputs the identifying code ID to decoder 24 which decodes the identifying code ID (to be described).

Figure 5:
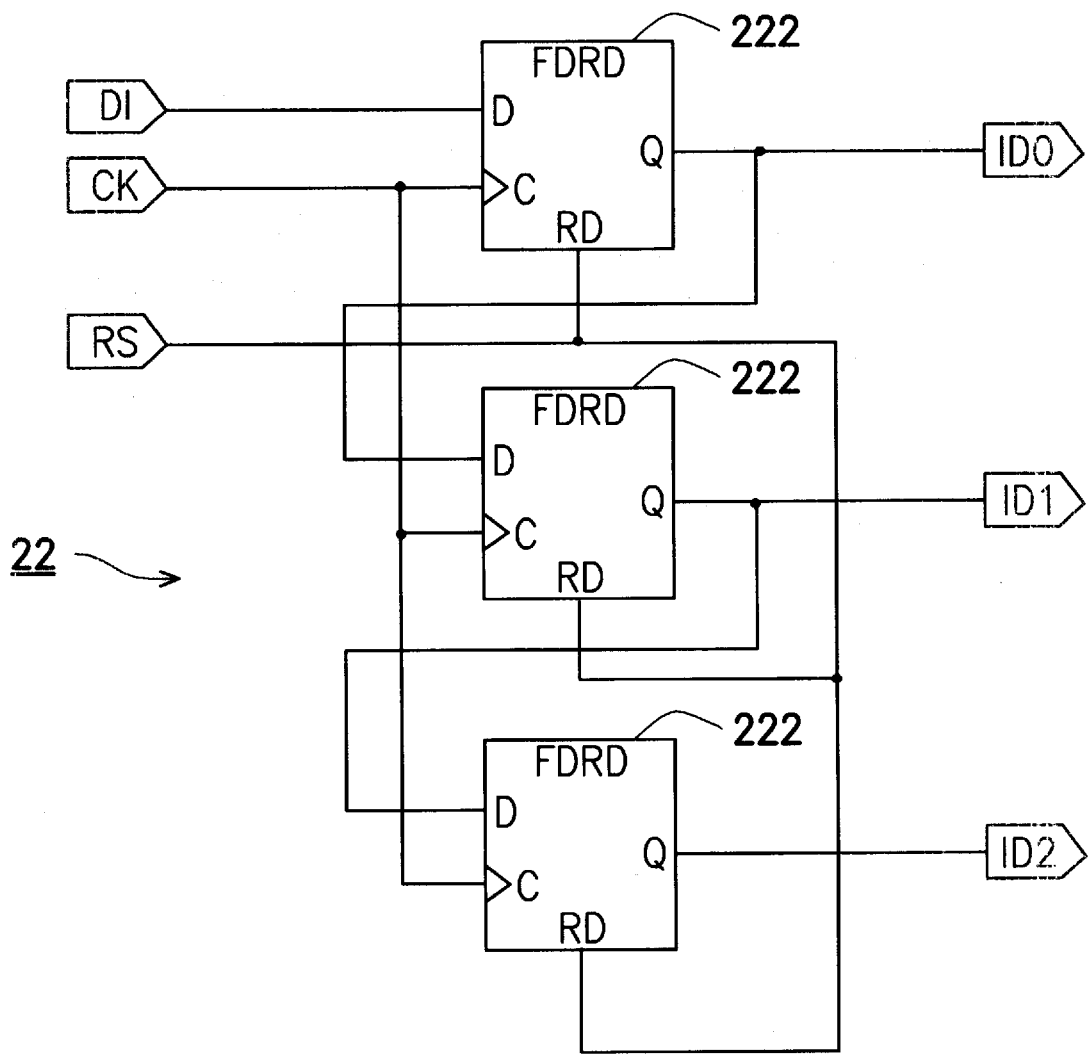
FIG. 5 is a schematic diagram of the second register array employed in the serial-to-parallel data conversion and transmission apparatus of FIG. 3.

FIG. 5 is a schematic diagram of second register array 22. As shown in FIG. 5, register 22 may include a cascade of three D-type flip-flops 222 which convert the identifying code ID into multi-bit parallel data that includes bits ID0, ID1 and ID2. D-type flip-flops 222 are simultaneously reset by signal RS prior to the initiation of each conversion cycle and are clocked simultaneously by clock signal CK.

Register array 22 is coupled to decoder 24 which receives and stores the parallel ID data. The enable pulse generator 26 supplies an enabling pulse $EN_1$ to decoder 24 which outputs an index signal $IN_1$ to the receiver identified by identifying code ID.

Figure 6:
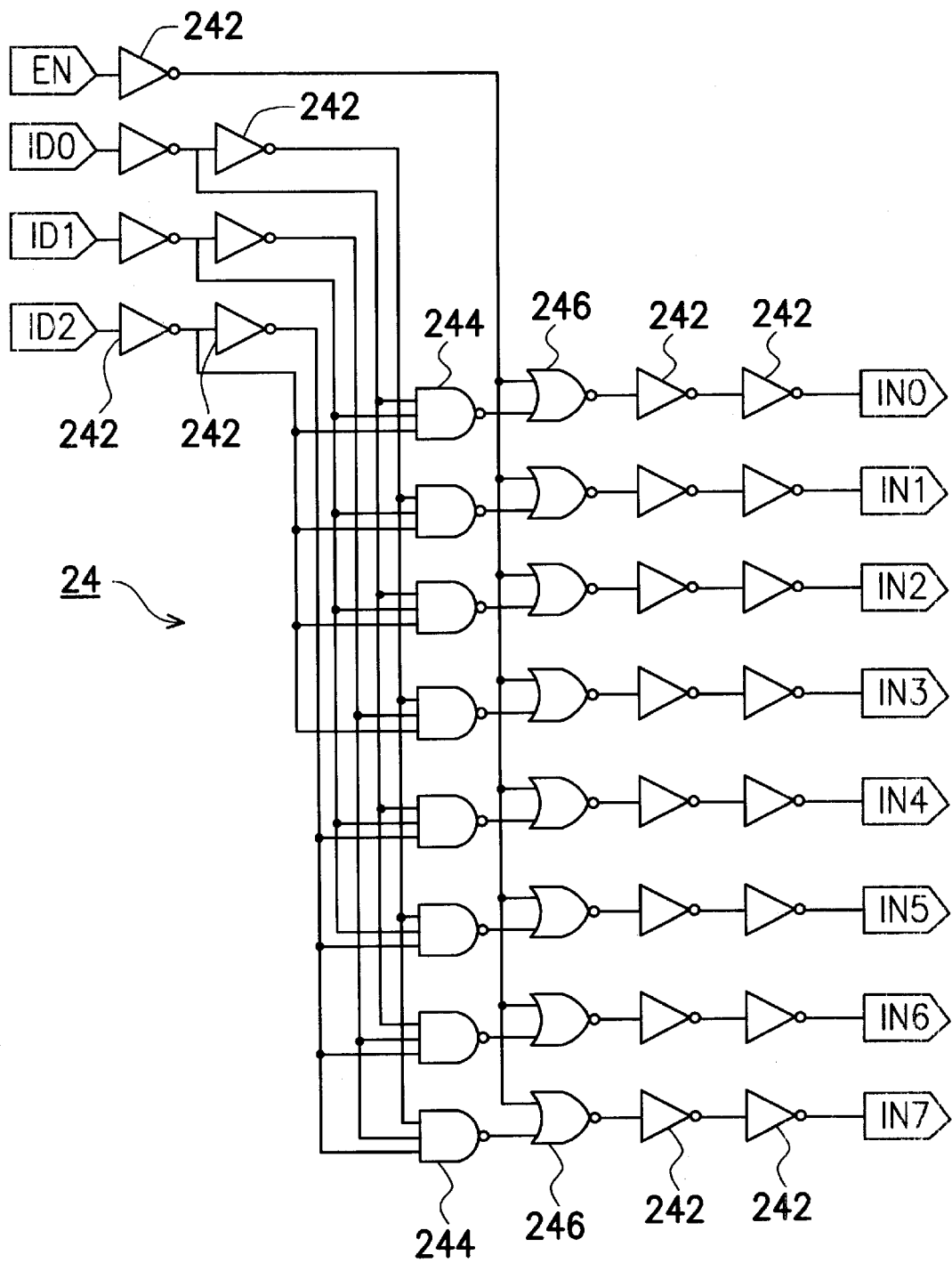
FIG. 6 is a schematic diagram of the decoder employed in the serial-to-parallel data conversion and transmission apparatus of FIG. 3.

FIG. 6 is a schematic diagram of decoder 24. As shown, decoder 24 is a gate-array-based decoder that comprises arrays of inverters 242, NAND gates 244 and NOR gates 246. The received parallel ID word, comprising bits ID0, ID1 and ID2, is subjected to the decoding of the gate array to produce decoded identification information which includes index signal bits IN0, IN1, ... IN7, an eight-bit index word in this exemplified embodiment.

Enable pulse generator 26 is coupled to decoder 24 (FIG. 3) and generates and supplies enable signal $EN_1$ to decoder 24 upon the strobing of chip select signal CS. Decoder 24, as described above, decodes and supplies the index signal $IN_1$ to the receiver identified by identifying code ID of the incoming data DI, which causes the selected receiver to receive the data portion DA of the incoming data DI as sent by the first register array 20.

Figure 7:
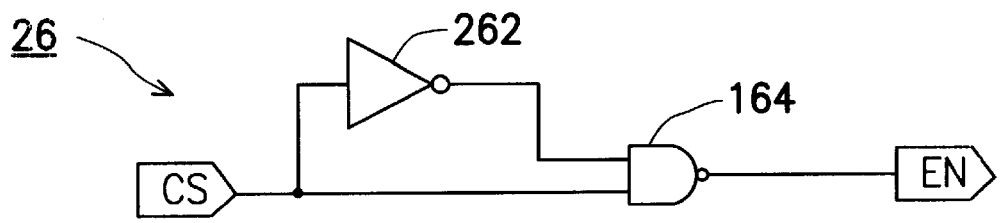
FIG. 7 is a schematic diagram of the enable pulse generator employed in the serial-to-parallel data conversion and transmission apparatus of FIG. 3.

FIG. 7 is a schematic diagram of enable pulse generator 26 for use in apparatus 2, which comprises a NAND gate 164 and an inverter 262, the operation of which is known in the art.

Figure 8:
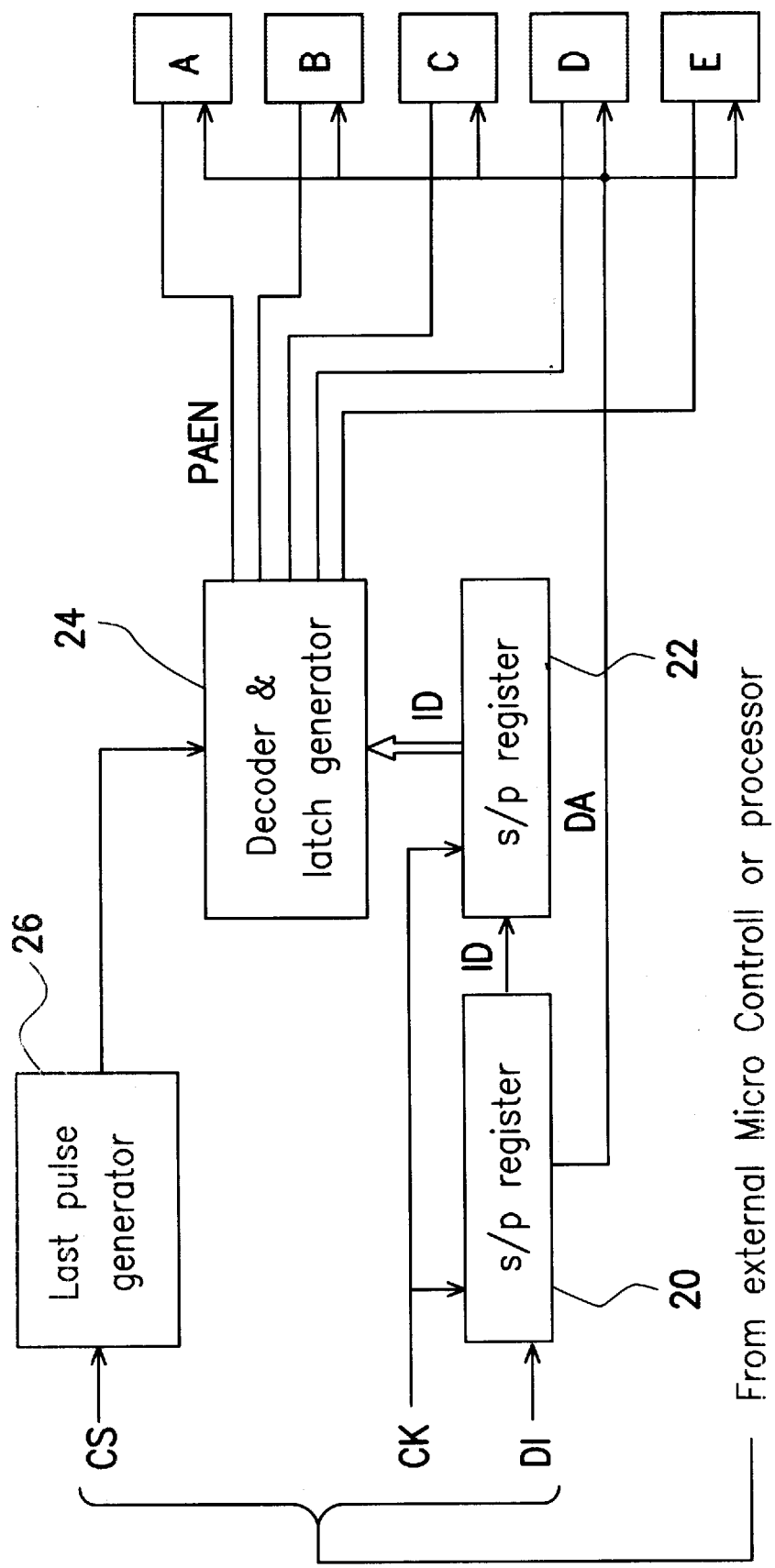
FIG. 8 is another block diagram of the serial-to-parallel data conversion and transmission apparatus in accordance with a preferred embodiment of the present invention.
Figure 9:
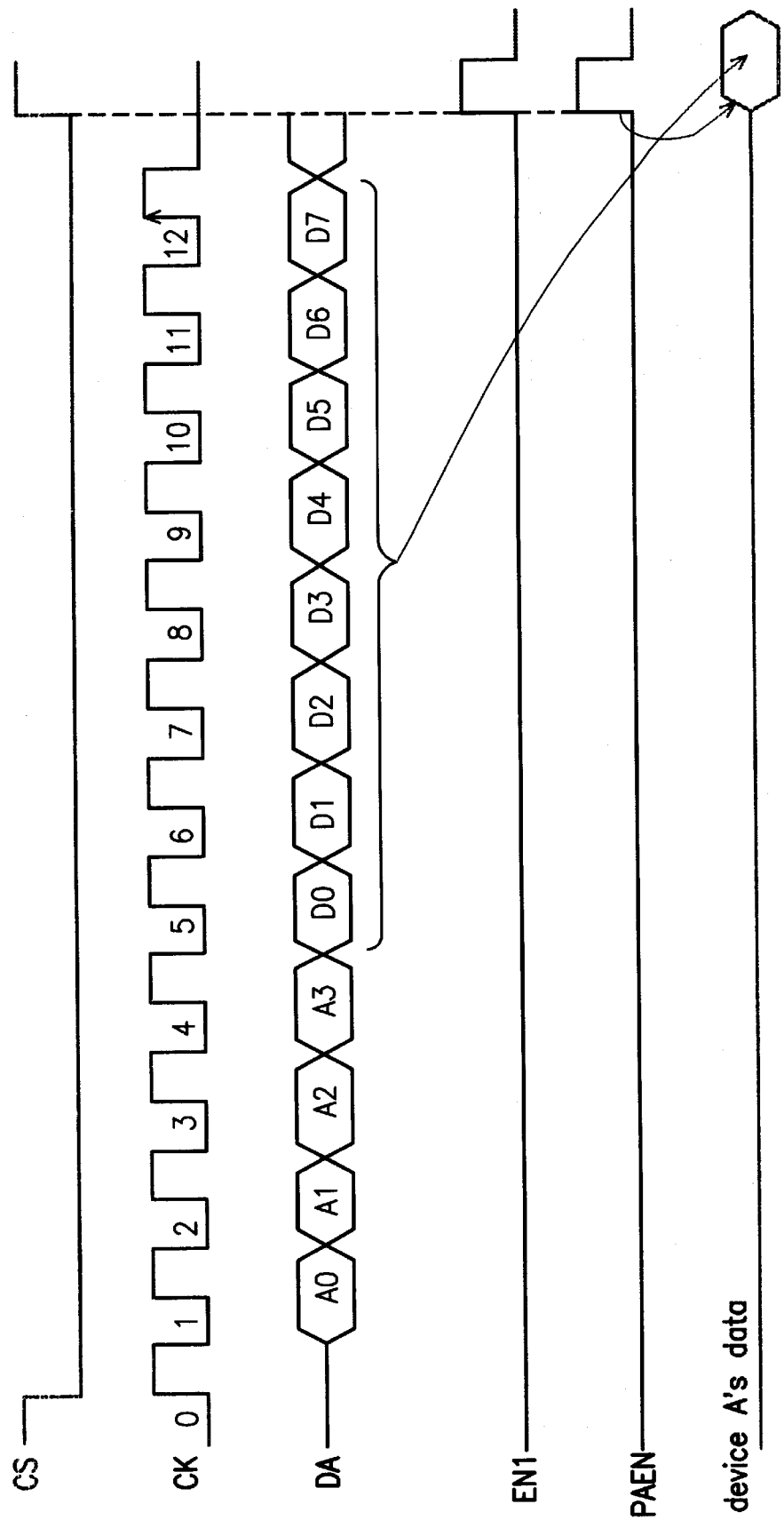
FIG. 9 is a timing diagram of several signals in the serial-to-parallel data conversion and transmission scheme of FIG. 8.

Referring next to FIG. 8, another block diagram of the serial-to-parallel data conversion and transmission apparatus of the present invention, along with several external devices A–E, are shown. The apparatus of FIG. 8 is inactive when chip select signal CS is high and is active when chip select signal CS is low, such as shown in FIG. 9. When signal CS is high, a 4-bit address and 8-bits of data are supplied from an external device (not shown) as incoming data DI (identified as a packet of information) to serial to parallel register 20 in synchronism with clock signal CK. Upon receipt of the 12 bit packet of information (i.e., 4-bit address and 8-bit data), chip select signal CS is driven to its inactive high state, and in response to signal CS going high, generator circuit 26 generates a "last pulse" signal EN1, such as shown in FIG. 9. The s/p register 20, to which the incoming date DI is supplied, converts the serially supplied data component of the supplied packet to a parallel 8-bit data word and supplies the data word to each of the external devices A–E. Register 20 supplies the serially supplied address of the packet to serial to parallel register 22 which converts the serial address to a 4-bit parallel address word. The clock signal CK is supplied to both registers 20 and 22 to provide the proper clocking control thereof. The 4-bit parallel address word is supplied from register 22 to the decoder and latch generator circuit 24 which decodes the address.

As previously mentioned, generator 26 generates an enable signal EN1 corresponding to the moment after a packet of information is supplied, wherein 12 bits of serially supplied information are provided for each packet. The enable signal EN1 is supplied to decoder and latch generator 24 which supplies the enable signal EN1 to the particular external peripheral device that is identified by the parallel ID signal supplied from register 22. When address ID identifies external device A, for example, enable signal EN1 is supplied as peripheral A enable signal PAEN to device A as shown in the timing diagrams of FIG. 9. At this time, no enable signals are supplied to external devices B–E.

In accordance with the present invention, each data amount is accompanied by a respective address so that the data (e.g., each 8-bit byte) is controlled to be supplied to an identified address. The address information that serially accompanies the serial supplied data is converted to a parallel word (e.g., 4-bit word) by register 22 and subsequently decoded in decoder/latch generator 24. The data information is converted to a parallel word (e.g., 8-bit word (or byte)) in register 20. Thus, each and every byte can be selectively controlled to be supplied to a different external device. For example, a first supplied data byte is accompanied by an address corresponding to device B, a subsequent byte is accompanied by an address corresponding to device D, etc. In this instance, only 1 byte of data is supplied to external device B and immediately thereafter the succeeding data byte is supplied to external device D. Of course, the data width can be established to be a single bit, two bits, 4 bits, 16 bits (i.e., 2 bytes), 32 bits, 64 bits, etc., so that the controllable amount of data to be supplied to the external devices can be preset depending on the needs of the system.

Figure 10:
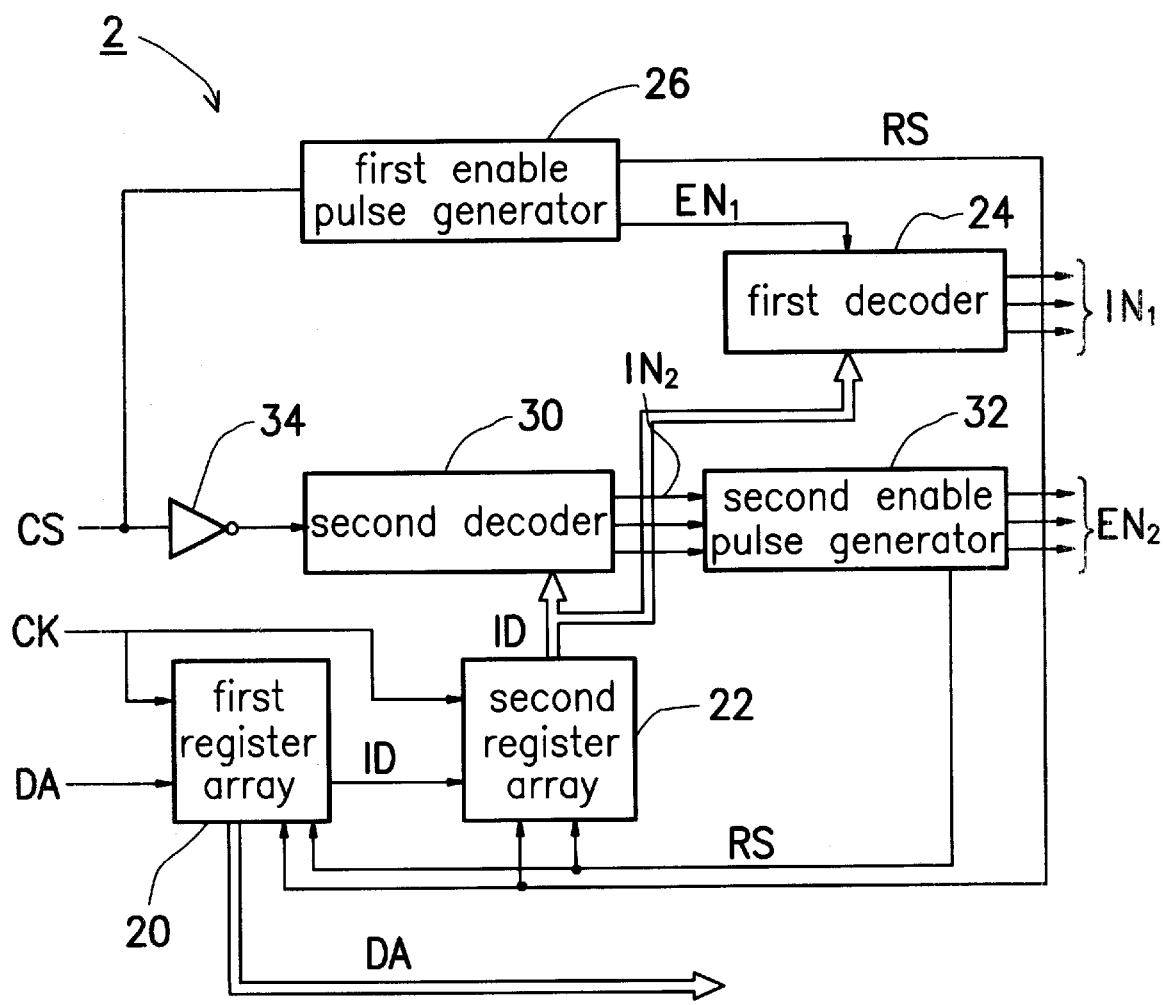
FIG. 10 is a schematic block diagram of a serial-to-parallel data conversion and transmission apparatus in accordance with another preferred embodiment of the present invention.

Referring next to FIG. 10, a schematic block diagram of the serial-to-parallel data conversion and transmission apparatus 2 in accordance with another preferred embodiment of the present invention is shown. In this embodiment, the serial-to-parallel data conversion and transmission apparatus 2 comprises, in addition to the components in the apparatus of FIG. 3, a second decoder 30 and a second enable pulse generator 32. In this embodiment, decoder 24 and enable pulse generator 26 are identified as first decoder 24 and first enable generator 26, respectively. Second decoder 30 and second enable pulse generator 32 allow for the utilization of chip select signal CS as a selection bit in order to reduce the number of bits necessary for the identification of an increased number of peripherals.

Second decoder 30 decodes identifying code ID of a supplied packet (incoming data DI) and further responds to an inverted chip select signal CS (as inversed by, for example, an inverter 34) for outputting a second index signal $IN_2$ to second enable pulse generator 32. In other words, the chip select signal CS may be utilized for control purposes in order that only one of the first and second decoders 24 and 30 are strobed for proper operation.

Second decoder 30 is coupled to second enable pulse generator 32 which receives the second index signal $IN_2$ and supplies a second enable pulse signal $EN_2$ to the receiver identified by identifying code ID, thereby causing the selected receiver to receive the data portion DA of the packet (incoming data DI) as supplied by first register array 20.

First and second enable pulse generators 26 and 32 are coupled to both first and second register arrays 20 and 22, and a reset signals RS may be issued by first enable pulse generator 26 and second enable pulse generator 32 after the first and second enable pulse signals $EN_1$ and $EN_2$ are issued, so that both register arrays 20 and 22 are reset thus clearing the data stored therein.

Thus, it can be observed that the serial-to-parallel data conversion and transmission apparatus and method of the present invention, as described in the embodiments, is capable of receiving incoming serial data that contains an identifying portion and converting the data into parallel format for direct transfer to the identified receiving sections without the need of intervention of the processor of the receiving party. No load to the system processor is added, while on the other hand, the process of serial-to-parallel data conversion and transmission in accordance with the present invention can be maintained at the highest possible throughput, also due to the lack of processor intervention. As a result, the advantage is two fold, firstly, there is a reduction in the processor load in the data receiving system as compared to conventional schemes where processor loads are increased due to their intervention. Secondly, the throughput of the data conversion and transmission process is improved since the process in automated and can function without the need for the processor to be involved in the identification of the incoming data.

The above-described preferred embodiments of the present invention are utilized only for the purpose of the description of the present invention. Persons skilled in this art can appreciate the fact that other similar arrangements can be devised from the embodiments disclosed above without departing from the spirit of the present invention, which is recited in the claims that follows.

What is claimed is:

1. A serial-to-parallel data conversion and transmission apparatus of a digital system for converting incoming serial data containing a data portion and identifying information into parallel data in response to a chip select signal, said converted parallel data being transmitted to a selected one of a plurality of receiving devices of said system, said apparatus comprising:

a first register array for storing the data portion of said incoming data, said first register array being coupled to said plurality of receiving devices for transmitting said stored data portion to said selected one of said receiving devices that corresponds to said identifying information;

a second register array for storing said identifying information of said incoming data, said second register array being coupled to said first register array;

a decoder coupled to said second register array for decoding said identifying information, said decoded identifying information being utilized for supplying an index signal to said receiving device that corresponds to said identifying information to select said receiving device; and an enable pulse generator coupled to said decoder for outputting an enable pulse signal to said decoder in response to said chip select signal, said decoder outputting said index signal to said selected one of said plurality of receivers that corresponds to said identifying information for allowing said selected receiver to receive said data portion of said incoming data sent by said first register array.

2. The serial-to-parallel data conversion and transmission apparatus of claim 1, further comprising:

a second decoder coupled to said second register array for decoding said identifying information of said incoming data, said second decoder outputting a second index signal corresponding to said identifying information in response to an inverse version of said chip select signal; and a second enable pulse generator coupled to said second decoder for outputting a second enable pulse signal to the receiver corresponding to said identifying information based on said second index signal for allowing said receiver to receive said data portion of said incoming data sent by said first register array.

3. The serial-to-parallel data conversion and transmission apparatus of claim 2, further comprising an inverter for generating said inverse version of said chip select signal.

4. The serial-to-parallel data conversion and transmission apparatus of claim 2, wherein said enable pulse generator and said second enable pulse generator are both coupled to said first and second register arrays and output a reset signal to said first and second register arrays.

5. A serial-to-parallel data conversion and transmission apparatus, comprising:

receiving means for serially receiving a packet of information, said packet including serial data bits and serial address bits, for converting the data bits of the received packet to a parallel data word, for supplying the parallel data word to each of a plurality of external devices, and for supplying the address bits of the received packet as an output;

converter means for converting the address bits supplied from said receiving means to a parallel address word and supplying the parallel address word as an identification signal as an output; and decoding means for decoding the identification signal to identify a selected one of the plurality of external devices and for supplying a read enable signal to said selected one of the plurality of external devices so that the selected external device is enabled to receive the parallel data word supplied from the receiving means.

6. The serial-to-parallel data conversion and transmission apparatus of claim 5, wherein said receiving means is a bit shift register.

7. The serial-to-parallel data conversion and transmission apparatus of claim 5, wherein said converter means is a bit shift register.

8. The serial-to-parallel data conversion and transmission apparatus of claim 5, further comprising means for receiving a chip select signal and for generating an enable pulse signal in response to said received chip select signal; and wherein said decoding means decodes said identification signal in response to said generated enable pulse signal.

9. The serial-to-parallel data conversion and transmission apparatus of claim 8, further comprising:

means for inverting said chip select signal to produce an inverted chip select signal;

second decoding means for decoding said identifying signal in accordance with the chip select signal to produce a second decoded signal; and means for generating a second enable pulse signal from said second decoded data and supplying said second enable pulse signal to the external devices so that the external device to which the read enable signal is supplied is enabled to receive the parallel data word supplied from the receiving means.

10. The serial-to-parallel data conversion and transmission apparatus of claim 9, wherein the second decoding means operates to decode the identifying signal utilizing the chip select signal as an external device selection data in addition to utilizing the identification sigal as selection data.

11. A serial-to-parallel data conversion and transmission method, comprising the steps of:

serially receiving a packet of information, the packet including serial data bits and serial address bits;

converting the data bits of the received packet to a parallel data word;

supplying the parallel data word to each of a plurality of external devices;

converting the received address bits to a parallel address word;

supplying the parallel address word as an identification signal;

decoding the identification signal to identify a selected one of the plurality of external devices; and supplying a read enable signal to the selected one of the plurality of external devices so that the selected external device is enabled to receive the supplied parallel data word.

12. The serial-to-parallel data conversion and transmission method of claim 11, wherein said step of receiving is carried out by using a bit shift register.

13. The serial-to-parallel data conversion and transmission method of claim 11, wherein said first and second steps of converting each is carried by using a bit shift register.

14. The serial-to-parallel data conversion and transmission method of claim 11, further comprising the steps of receiving a chip select signal; and generating an enable pulse signal in response to the received chip select signal; and wherein the decoding step is carried out in response to the generated enable pulse signal.

15. The serial-to-parallel data conversion and transmission method of claim 14, further comprising:

inverting the chip select signal to produce an inverted chip select signal;

decoding the identifying signal in accordance with the chip select signal to produce a second decoded signal; and generating a second enable pulse signal from the second decoded data and supplying the second enable pulse signal to the external devices so that the external device to which the read enable signal is supplied is enabled to receive the supplied parallel data word.

16. The serial-to-parallel data conversion and transmission method of claim 15, wherein the second decoding step is carried out by decoding the identifying signal utilizing the chip select signal as an external device selection data in addition to utilizing the identification sigal as selection data.

* * * * *